United States Patent [19]

United States Patent [19]
Ahne et al.

[11] 4,332,883
[45] Jun. 1, 1982

[54] METHOD FOR THE MANUFACTURE OF HIGHLY HEAT-RESISTANT RELIEF STRUCTURES

[75] Inventors: Hellmut Ahne, Röttenbach; Eberhard Kühn, Hemhofen; Roland Rubner, Röttenbach; Erwin Schmidt, Erlangen, all of Fed. Rep. of Germany

[73] Assignee: Siemens Aktiengesellschaft, Berlin and Munich, Fed. Rep. of Germany

[21] Appl. No.: 179,472

[22] Filed: Aug. 19, 1980

[30] Foreign Application Priority Data

Aug. 21, 1979 [DE] Fed. Rep. of Germany ....... 2933805

[51] Int. Cl.$^3$ ............................................... G03C 5/00
[52] U.S. Cl. ............................... 430/322; 204/159.14; 204/159.19; 430/9; 430/18; 430/270; 430/280; 430/281; 430/296; 430/325
[58] Field of Search ................ 430/9, 18, 270, 280, 430/281, 296, 322, 253, 254; 204/259.14, 259.15, 259.19

[56] References Cited

U.S. PATENT DOCUMENTS 3,957,512  5/1976  Kleeberg et al. .................. 430/311

*Primary Examiner*—Jack P. Brammer
*Attorney, Agent, or Firm*—Kenyon & Kenyon

[57] ABSTRACT

Disclosed herein is a method for the preparation of highly heat-resistant relief structures by applying radiation-sensitive soluble polymer precursor stages in the form of a layer or a foil to a substrate; irradiating the layer or foil through negative patterns with actinic light or by deflecting a light, electron or ion beam; removing the non-irradiated layer or foil portions and, optionally, subsequently annealing, as well as to the use of the relief structures made in this manner. An object of the invention is to broaden the supply of highly heat-resistant relief structures, and for this purpose it is provided to use precursor stages of polyoxazoles in the form of addition products of olefinically unsaturated monoepoxides on hydroxyl group-containing polycondensation products of aromatic and/or heterocyclic dihydroxy diamino compounds with dicarboxylic-acid chlorides or esters. The relief structures prepared by the method according to the invention are suitable particularly for use as resists, surface coating material and insulation material.

8 Claims, No Drawings

METHOD FOR THE MANUFACTURE OF HIGHLY HEAT-RESISTANT RELIEF STRUCTURES

BACKGROUND OF THE INVENTION

The present invention relates to a method for manufacturing highly heat-resistant relief structures by applying radiation-sensitive soluble polymer precursor stages in the form of a layer or a foil on a substrate; irradiating the layer or the foil through negative patterns with actinic light or by deflecting a light, electron or ion beam; removing the non-irradiated layer or foil portions and, optionally, subsequently annealing, as well as to the use of relief structures prepared in this manner.

A method of the type mentioned for manufacturing relief structures on the basis of polymers is known from German Pat. No. 2 308 830 and its corresponding U.S. Pat. No. 3,957,512. According to this method, polyaddition or polycondensation products of polyfunctional carbocyclic or heterocyclic compounds, carrying radiation-sensitive radicals, with diamines, diisocyanates, bis-acid chlorides or dicarboxylic acids are used as the soluble polymer precursor stages. The compounds which carry radiation-sensitive radicals contain two carboxyl, carboxylic-acid chloride, amino, isocyanate or hydroxyl groups suitable for addition or condensation reactions and radiation-reactive groups bound to carboxyl groups in ester-fashion partially in ortho- or peri-position thereto. The diamines, bis-acid chlorides and dicarboxylic acids to be reacted with these compounds have at least one cyclic structure element.

The soluble polymer precursor stages are cross-linked when irradiated and change in the process into insoluble intermediate products. These intermediate products are subjected, when being annealed, to a cyclizing process, whereby highly heat-resistant polymers of the following classes of materials are formed: polyimides, polyamidimides, poly-1,3-quinazoline-2,6-diones, polyisoindoloquinazoline diones, poly-1,3-oxazine-6-ones and polybenz-1,3-oxazine-2,4-diones.

SUMMARY OF THE INVENTION

It is an object of the present invention to develop further the method of the type mentioned at the outset in such a manner that the supply of highly heat-resistant relief structures is broadened.

According to this invention, this and other objects are achieved by the provision that precursor stages of polyoxazoles are used in the manufacture of highly heat-resistant relief structures. According to the invention, the polyoxazole precursor stage is an addition product of (a) an olefinically unsaturated monoepoxide and (b) a hydroxyl group-containing polycondensation product of (1) an aromatic and/or heterocyclic dihydroxydiamino compound and (2) a dicarboxylic acid chloride or ester.

Relief structures of the polyoxazole type were heretofore unknown. The relief structures which are prepared according to the method of the present invention, and which are based on these materials, have excellent temperature stability in nitrogen as well as in air. High thermal stability is required in modern structuring techniques such as dry-etching and with ion implantation. The polyoxazole relief structures prepared by the method according to the present invention are, in addition, highly hydrolysis-resistant and have high resistance to alkaline etching baths, which is important particularly for wet-etching processes.

With the method according to the invention, the polymer precursor stages can advantageously be used together with light- or radiation-sensitive copolymerizable compounds, N-substituted maleinimides being preferably used for this purpose. However, acrylate or methacrylate group-containing compounds may also be used. Furthermore, customary photo initiators and/or sensitizers also can be used (cf., "Industrie Chimique Belge", 24, 1959, pages 739 to 764, as well as J. Kosar, "Light-Sensitive Systems", John Wiley & Sons, Inc., New York 1965, pages 143 to 146 and pages 160 to 188). Particularly well suited are Michler's ketone and/or benzoine ether, 2-tert-butyl-9,10-anthraquinone, 1,2-benz-9,10-anthraquinone and 4,4'-bis-(diethylamino)-benzophenone. In the method according to the present invention, adhesion agents can be used to advantage. This purpose is served particularly by silanes such as vinyl-triethoxy-silane, vinyl-tris($\beta$-methoxy-ethoxy)-silane, $\gamma$-methacryloxy-propyl-trimethoxy silane and $\gamma$-glycidoxypropyl-trimethoxy silane.

The radiation-reactive polyoxazole precursor stages employed with the method according to the present invention which are of oligomeric and/or polymeric nature, are described in the concurrently-filed U.S. Pat. Application "Polyoxazole Precursor Stages And The Preparation Thereof", Ser. No. 179,462, filed Aug. 19, 1980. These precursor stages generally have the following structure:

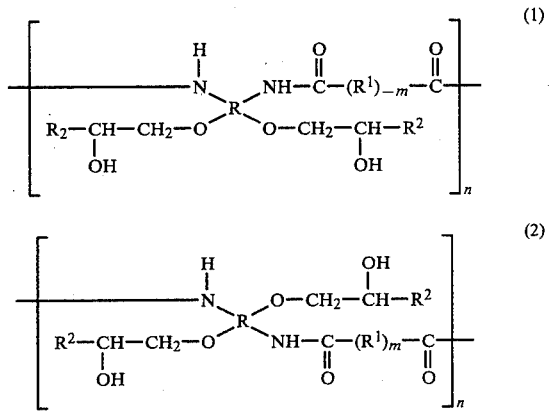

In Formulas (1) and (2), n stands for an integral number from 2 to 100 and m is 0 or 1.

The following applies to R, $R^1$ and $R^2$:

R is an optionally halogenated, at least partially aromatic and/or heterocyclic tetravalent, i.e., tetrafunctional, radical, where two valences always are arranged adjacent to each other; if the radical R has several aromatic and/or heterocyclic structure elements, the valence pairs are located at respective end-position structure elements of this type;

$R^1$ is an optionally halogenated divalent, i.e., difunctional, radical with an aliphatic and/or cycloaliphatic structure, optionally having hetero atoms, and/or an aromatic and/or heterocyclic structure; and $R^2$ is an olefinically unsaturated radical, for example, an allyl ether-containing group, particularly an optionally substituted (meth) acryl-ester-containing group.

Preferred are addition products of glycidyl acrylate or glycidyl methacrylate on the polycondensation product of 3,3'-dihydroxybenzidine and isophthalic-acid dichloride or benzophenone dicarboxylic-acid dichloride. An example of such a polymer precursor stage is shown in the following Formula (3):

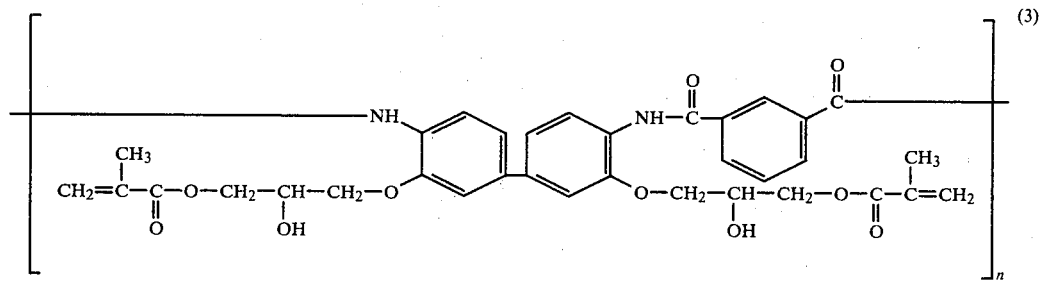

The relief structures according to the present invention are prepared, as earlier set forth, in such a manner that the polymer precursor stage is applied onto a substrate in the form of a layer or a foil and is exposed through a mask with actinic light or is irradiated by deflecting a light, electron or ion beam; subsequently, the non-exposed layer or foil portions are dissolved out or stripped off and the so obtained relief structures then optionally annealed. The precursor stage can advantageously be applied to the substrate dissolved in an organic solvent, N-methylpyrrolidone preferably being used as the solvent. The concentration of the solution can be adjusted so that with the known coating methods such as centrifuging, immersion, spraying, brushing or rolling-on, layer thicknesses of 0.01 to several hundred μm can be produced. It has been found, for example, that with centrifuge coating, 300 to 10,000 RPM for 1 to 100 seconds are suitable for obtaining a uniform and high surface quality. The photoresist layer which is applied to the substrate, consisting preferably of glass, metal, plastic or semiconductor material, can be freed of the solvent in a nitrogen or air stream at room temperature or at elevated temperature, preferably at a temperature of 50° to 80° C. In addition, one can also work in a vacuum.

To obtain a sufficient difference in the solubility between the irradiated and the non-irradiated layer or foil portions, exposure times of between about 20 and 800 seconds are sufficient with the method according to the present invention, depending upon the composition and the layer thickness, if a 500-W very-high-pressure mercury lamp is used. After the exposure, the unexposed parts of the layer or foil are dissolved out, preferably with an organic developer.

By means of the method according to the present invention, images with sharp contours, i.e., relief structures, are obtained which are converted by annealing into highly heat-resistant polymers which are resistant to acids and alkaline solutions. In general, temperatures from about 220° to 500° C. can be selected for the annealing, preferably temperatures from about 300° to 400° C. The annealing time is, in general, half an hour, and discoloration is not observed either in nitrogen or air. The edge sharpness and the dimensional accuracy of the relief structures are practically unimpaired by the anneal. In addition, the high surface quality of the relief structures is preserved despite a loss in layer thickness that takes place during the anneal.

In the method according to the present invention, polymer precursor stages of aromatic components preferably are used, so that in the thermal treatment, i.e., in the anneal, polymers in the form of polyoxazoles with the following structural unit (4) are obtained:

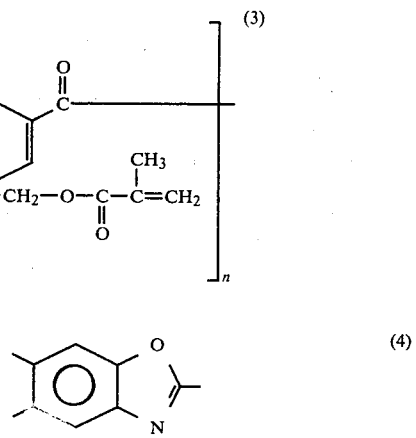

Polyoxazoles are among the semiladder polymers and are distinguished by high temperature stability (up to about 500° C.).

The relief structures according to the present invention can be utilized for the preparation of passivating layers on semiconductor components, thin- and thick-film circuits, solder protection layers on multilayer circuits, insulating layers as a component of multilayer circuits and miniaturized insulating layers on electrically conducting and/or semiconducting and/or insulating base materials, particularly in the field of microelectronics, or generally for the fine-structuring of substrates. Preferably, the highly heat-resistant relief structures serve as masks for wet- and dry-etching processes, electroless or electrolytic metal deposition and vapor deposition methods as well as for masks for ion implantation, and in addition, as insulating and protective layers in electrotechnology. The relief structures can further be used to advantage as orientation layers, for example, in liquid-crystal displays as well as for the rastering of surfaces, for example, in x-ray screens, particularly in x-ray image amplifiers.

DETAILED DESCRIPTION OF THE INVENTION

Preparation of a Radiation-Reactive Polybenzoxazole Precursor Stage

To a solution of 6.49 parts by weight 3,3'-dihydroxybenzidine in 50 parts by volume dimethylacetamide and 9 parts by volume pyridine are added dropwise, while stirring vigorously at a temperature of −5° to −20° C. within about 30 minutes, 6.1 parts by weight isophthalic-acid dichloride in 20 parts by volume cyclohexanone. After further stirring for 3 hours at room temperature, the viscous reaction solution is allowed to stand overnight; the solution then is added dropwise into 1000 parts by volume water, while stirring. The so-precipitated resin is separated, washed with water and methanol, and dried in a vacuum at about 60° C.

10 parts by weight of the polybenzoxazole prepolymer prepared in the described manner are dissolved in 100 parts by volume N-methyl-pyrrolidone. To this solution are added 50 parts by volume glycidyl methacrylate, 0.5 parts by volume benzyldimethylamine and 0.5 parts by weight hydroquinone. After heating for 2 hours to a temperature of about 90° C., the reaction product is precipitated from 1000 parts by volume ethanol, while stirring. After drying in a vacuum, a yellow-brown powder is obtained.

PREPARATION OF A RELIEF STRUCTURE 5 parts by weight of the polybenzoxazole precursor stage prepared in the manner described above are dissolved together with 0.25 parts by weight N-phenyl-maleinimide, 0.1 parts by weight Michler's ketone and 0.05 parts by volume vinyl-tris($\beta$-methoxy-ethoxy)-silane, in 20 parts by volume of a mixture of dimethylacetamide and dioxane (volume ratio 1:1). The solution is centrifuged at 1000 RPM to form films on a silicon wafer with a silicon dioxide surface. This is followed by drying at about 65° C. in a vacuum for 3 hours and then by exposure through a contact test mask for 6 minutes with a 500-W very-high-pressure mercury lamp. The film is developed for 45 seconds with a solvent mixture of methylethyl ketone, N-methylpyrrolidone, $\gamma$-butyrolactone and toluene (volume ratio 1:1:1:1). A relief structure with a layer thickness of 4 $\mu$m and a resolution of 7 $\mu$m is obtained. The subsequent anneal at 275° C. and 400° C., each time for half an hour, leads to a layer thickness of 2.1 $\mu$m without impairment of the structure quality.

The relief structures according to the invention are preferably suitable for application as a resist with intermediate protective function for lithographic structuring of surfaces, particularly for the dry etching process, or for permanent coating or screening of surfaces, or as a protective or insulating material for electrical engineering purposes.

What is claimed is:

1. In a method for the manufacture of a highly heat-resistant relief structure wherein a radiation-sensitive soluble polymer precursor stage is applied in the form of a layer or foil on a substrate; the layer or the foil is irradiated through negative patterns with actinic light or by deflecting a light, electron or ion beam; and the non-irradiated layer or foil portions are removed, the improvement comprising utilizing as said precursor stage a polyoxazole precursor in the form of an addition product of (a) an olefinically unsaturated monoepoxide and (b) a hydroxyl group-containing polycondensation product of (1) an aromatic and/or heterocyclic dihydroxydiamino compound and (2) a member selected from dicarboxylic acid chloride and dicarboxylic acid ester.

2. The method according to claim 1 wherein said polymer precursor stage is used together with a light- or radiation-sensitive copolymerizable compound.

3. The method according to claim 2 wherein said copolymerizable compound comprises an N-substituted maleinimide.

4. The method according to claim 1 wherein said polymer precursor stage is utilized together with an adhesion agent.

5. The method according to claim 4 wherein said adhesion agent comprises a silane.

6. The method according to claim 1 wherein said precursor stage comprises an addition product of glycidyl acrylate or glycidyl methacrylate on the polycondensation product of 3,3'-dihydroxybenzidine and a member selected from the group consisting of isophthalic-acid dichloride and benzophenone dicarboxylic-acid dichloride.

7. The method according to claim 1 wherein said layer or foil from which non-irradiated portions are removed is subsequently annealed.

8. A highly heat-resistant relief structure prepared in accordance with the method of claim 1.

* * * * *